United States Patent
Yamazaki et al.

(10) Patent No.: US 9,859,454 B2
(45) Date of Patent: Jan. 2, 2018

(54) PHOTOELECTRIC CONVERSION DEVICE AND FABRICATION METHOD THEREOF

(71) Applicant: Semiconductor Energy Laboratory Co., Ltd., Atsugi-shi, Kanagawa-ken (JP)

(72) Inventors: Shunpei Yamazaki, Setagaya (JP); Kazuo Nishi, Fujisawa (JP)

(73) Assignee: SEMICONDUCTOR ENERGY LABORATORY CO., LTD., Kanagawa-ken (JP)

( * ) Notice: Subject to any disclaimer, the term of this patent is extended or adjusted under 35 U.S.C. 154(b) by 393 days.

(21) Appl. No.: 14/251,935

(22) Filed: Apr. 14, 2014

(65) Prior Publication Data

US 2014/0220730 A1    Aug. 7, 2014

Related U.S. Application Data

(62) Division of application No. 13/022,827, filed on Feb. 8, 2011, now Pat. No. 8,704,083.

(30) Foreign Application Priority Data

Feb. 11, 2010 (JP) ................................ 2010-028310

(51) Int. Cl.
*H01L 31/18* (2006.01)
*H01L 31/028* (2006.01)
(Continued)

(52) U.S. Cl.
CPC .......... *H01L 31/182* (2013.01); *H01L 31/028* (2013.01); *H01L 31/046* (2014.12);
(Continued)

(58) Field of Classification Search
CPC ... H01L 31/028; H01L 31/077; H01L 31/186; H01L 31/0465; H01L 31/182; H01L 31/046; H01L 31/0463; H01L 31/1872
See application file for complete search history.

(56) References Cited

U.S. PATENT DOCUMENTS 5,147,468 A   9/1992   Deguchi
5,605,846 A   2/1997   Ohtani et al.
(Continued)

FOREIGN PATENT DOCUMENTS

EP    1198014 A   4/2002
EP    1798760 A   6/2007
(Continued)

*Primary Examiner* — Golam Mowla
(74) *Attorney, Agent, or Firm* — Robinson Intellectual Property Law Office; Eric J. Robinson

(57) ABSTRACT

In a thin film photoelectric conversion device fabricated by addition of a catalyst element with the use of a solid phase growth method, defects such as a short circuit or leakage of current are suppressed. A catalyst material which promotes crystallization of silicon is selectively added to a second silicon semiconductor layer formed over a first silicon semiconductor layer having one conductivity type, the second silicon semiconductor layer is partly crystallized by a heat treatment, a third silicon semiconductor layer having a conductivity type opposite to the one conductivity type is stacked, and element isolation is performed at a region in the second silicon semiconductor layer to which a catalyst material is not added, so that a left catalyst material is prevented from being diffused again, and defects such as a short circuit or leakage of current are suppressed.

13 Claims, 6 Drawing Sheets

(51) Int. Cl.
*H01L 31/077* (2012.01)
*H01L 31/046* (2014.01)
*H01L 31/0463* (2014.01)
*H01L 31/0465* (2014.01)
*H01L 21/02* (2006.01)

(52) U.S. Cl.
CPC ...... *H01L 31/0463* (2014.12); *H01L 31/0465* (2014.12); *H01L 31/077* (2013.01); *H01L 31/186* (2013.01); *H01L 31/1872* (2013.01); *H01L 21/0245* (2013.01); *H01L 21/02532* (2013.01); *H01L 21/02672* (2013.01); *Y02E 10/547* (2013.01); *Y02P 70/521* (2015.11)

(56) References Cited

U.S. PATENT DOCUMENTS

| | | | |
|---|---|---|---|
| 5,606,179 | A | 2/1997 | Yamazaki et al. |
| 5,614,426 | A | 3/1997 | Funada et al. |
| 5,700,333 | A | 12/1997 | Yamazaki et al. |
| 5,736,431 | A | 4/1998 | Shinohara et al. |
| 5,851,860 | A | 12/1998 | Makita et al. |
| 5,854,096 | A | 12/1998 | Ohtani et al. |
| 6,133,119 | A | 10/2000 | Yamazaki |
| 6,184,068 | B1 | 2/2001 | Ohtani et al. |
| 6,326,248 | B1 | 12/2001 | Ohtani et al. |
| 6,589,824 | B2 | 7/2003 | Ohtani et al. |
| 6,620,288 | B2 | 9/2003 | Shinohara et al. |
| 6,632,993 | B2 | 10/2003 | Hayashi et al. |
| 6,815,259 | B2 | 11/2004 | Ninomiya et al. |
| 6,827,787 | B2 | 12/2004 | Yonezawa et al. |
| 6,846,696 | B2 | 1/2005 | Adachi et al. |
| 6,919,237 | B2 | 7/2005 | Ohtani et al. |
| 7,449,718 | B2 | 11/2008 | Nishi et al. |
| 7,470,575 | B2 | 12/2008 | Ohtani et al. |
| 7,674,647 | B2 | 3/2010 | Arai |
| 7,767,559 | B2 | 8/2010 | Ohtani et al. |
| 7,845,071 | B2 | 12/2010 | Morooka et al. |
| 7,858,431 | B2 | 12/2010 | Isaka et al. |
| 8,125,033 | B2 | 2/2012 | Yang et al. |
| 2006/0097259 | A1 | 5/2006 | Suezaki et al. |
| 2006/0118166 | A1 | 6/2006 | Iwaki |
| 2007/0163636 | A1 | 7/2007 | Arai |
| 2008/0196761 | A1 | 8/2008 | Nakano et al. |
| 2008/0245406 | A1 | 10/2008 | Yamazaki et al. |
| 2008/0251126 | A1 | 10/2008 | Yamazaki et al. |
| 2009/0117680 | A1 | 5/2009 | Yamazaki et al. |
| 2009/0120498 | A1 | 5/2009 | Yamazaki et al. |
| 2009/0127555 | A1 | 5/2009 | Yamazaki et al. |
| 2009/0139558 | A1 | 6/2009 | Yamazaki et al. |
| 2009/0142908 | A1 | 6/2009 | Isaka et al. |
| 2009/0165854 | A1 | 7/2009 | Yamazaki et al. |
| 2009/0209059 | A1 | 8/2009 | Isaka et al. |
| 2009/0242032 | A1 | 10/2009 | Yamazaki et al. |
| 2009/0267066 | A1 | 10/2009 | Yamazaki et al. |
| 2009/0277504 | A1 | 11/2009 | Yamazaki |
| 2009/0293954 | A1 | 12/2009 | Yamazaki |
| 2009/0320897 | A1 | 12/2009 | Shimomura |
| 2010/0006141 | A1 | 1/2010 | Oikawa et al. |
| 2010/0047952 | A1 | 2/2010 | Ohnuma et al. |
| 2010/0059099 | A1 | 3/2010 | Arai |
| 2010/0071767 | A1 | 3/2010 | Kato et al. |
| 2010/0078071 | A1 | 4/2010 | Miyairi et al. |
| 2010/0139766 | A1 | 6/2010 | Toriumi et al. |
| 2010/0229934 | A1 | 9/2010 | Jang |
| 2010/0275990 | A1 | 11/2010 | Shimomura et al. |
| 2010/0307557 | A1 | 12/2010 | Yamazaki et al. |
| 2010/0307559 | A1 | 12/2010 | Yamazaki et al. |
| 2011/0000545 | A1 | 1/2011 | Nishi et al. |
| 2011/0048533 | A1 | 3/2011 | Lee et al. |

FOREIGN PATENT DOCUMENTS

| | | |
|---|---|---|
| JP | 04-154175 A | 5/1992 |
| JP | 07-058338 A | 3/1995 |
| JP | 08-031737 A | 2/1996 |
| JP | 08-069968 A | 3/1996 |
| JP | 08-125194 A | 5/1996 |
| JP | 08-340127 A | 12/1996 |
| JP | 2002-261313 A | 9/2002 |
| JP | 2007-165905 A | 6/2007 |
| WO | WO-2009/017373 | 2/2009 |

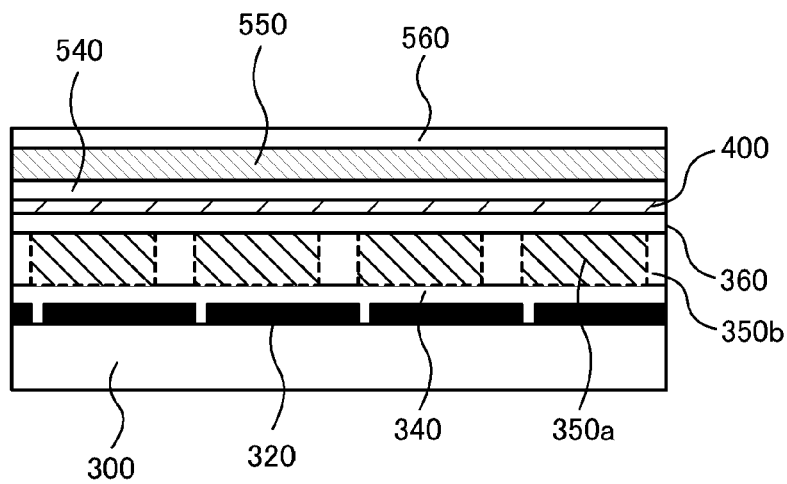
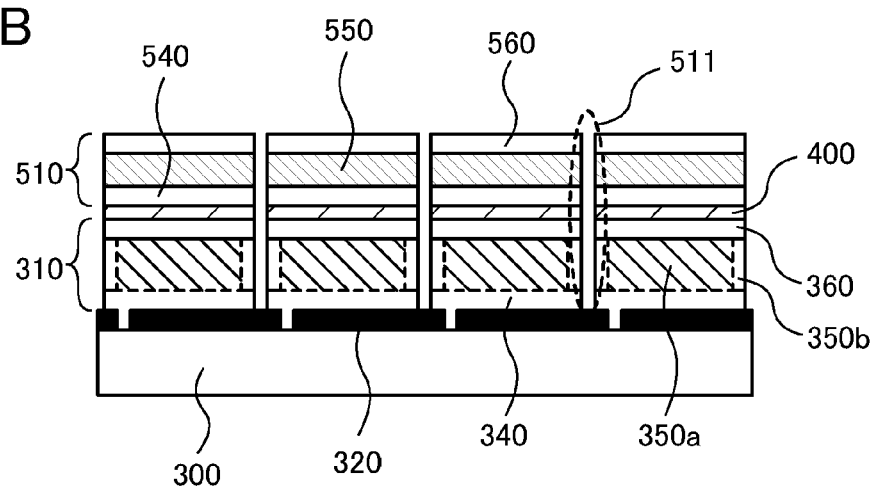
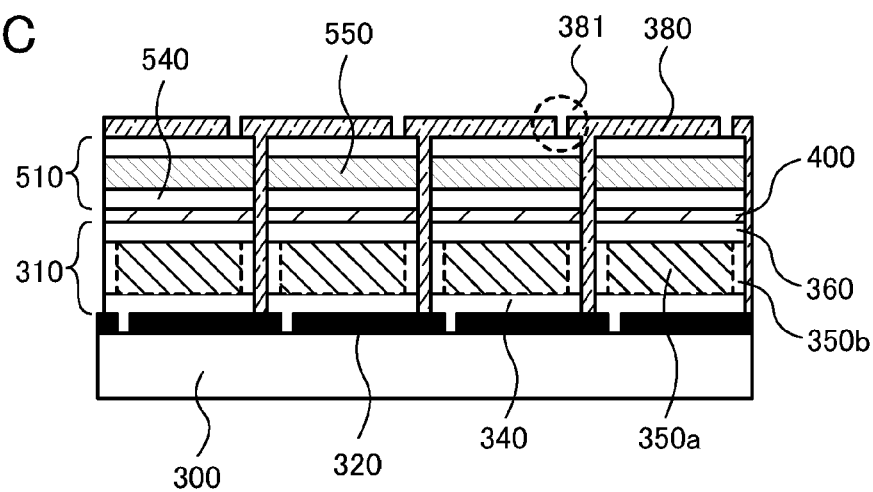

PHOTOELECTRIC CONVERSION DEVICE AND FABRICATION METHOD THEREOF

BACKGROUND OF THE INVENTION

1. Field of the Invention

The present invention relates to a photoelectric conversion device in which a crystalline silicon film is used and the fabrication method threreof.

2. Description of the Related Art

A photoelectric conversion device such as a solar cell has been well known as an attractive power generation means without carbon dioxide emissions. A photoelectric conversion device can be fabricated using a silicon semiconductor or a compound semiconductor, and a silicon semiconductor is used for most of photoelectric conversion devices sold in the market. A photoelectric conversion device in which a silicon semiconductor is used can be classified into a bulk photoelectric conversion device in which a wafer of single crystal silicon, polycrystalline silicon, or the like is used and a thin film photoelectric conversion device in which a silicon film is formed over a substrate. In order to spread photoelectric conversion devices, it is necessary to reduce the manufacturing cost. In the thin film photoelectric conversion device, the photoelectric conversion layer can be formed with a small amount of raw material in comparison with the bulk photoelectric conversion device; therefore, it is expected to reduce the cost.

Although, in the field of the thin film photoelectric conversion device, a photoelectric conversion device in which amorphous silicon is used is in practical use, its conversion efficiency is lower than that of a photoelectric conversion device in which single crystal silicon or polycrystalline silicon is used. In addition, the photoelectric conversion device in which amorphous silicon is used has problems specific to amorphous silicon such as a light deterioration phenomenon, and in some respects the device is not suitable to the outside use which requires large power generation. Therefore, a photoelectric conversion device including a crystal silicon thin film with high conversion efficiency and without a problem of light deterioration phenomenon has been developed.

The crystal silicon thin film can be formed by a vapor deposition method or a solid phase growth method. However, in the case where a glass substrate is used for a support body, it is difficult to achieve both a high growth speed capable of achieving the productivity and an excellent crystallinity even if either method is applied because the process temperature has an upper limitation.

As a method for solving the above problems, it is disclosed in Patent Document 1 that crystallization of an amorphous silicon film can be promoted by addition of a slight amount of a catalyst material. A heavy metal such as nickel (Ni), iron (Fe), cobalt (Co), or platinum (Pt) serves as a catalyst, and makes it possible to decrease the heat treatment temperature and to reduce the process time. Specifically, it is described in Patent Document 1 that a high-quality crystal can be obtained by a heat treatment performed at 550° C. for 4 hours.

In addition, a method for fabricating a thin film crystal silicon based photoelectric conversion device, in which gettering of a catalyst material is performed using phosphorus (P) or the like because the above heavy metal serves as a life time killer of carriers induced by light in a photoelectric conversion layer, is disclosed in Patent Document 2.

REFERENCE

[Patent Document 1] Japanese Published Patent Application No. H7-58338

[Patent Document 2] Japanese Published Patent Application No. H8-340127

SUMMARY OF THE INVENTION

For a thin film crystal silicon based photoelectric conversion device, a photoelectric conversion layer which is at least a few μm in thickness is necessary. Therefore, a heat treatment (a solid phase growth method) using a method for addition of a catalyst material which makes it possible to grow to crystal silicon with an excellent crystalinity for a short period is a very attractive method.

As described above, if the heavy metal which is the catalyst material is once taken in silicon, the heavy metal forms a defect level and degrades the electrical characteristics of the element. However, it is confirmed that, in the silicon film for which the heat treatment has been performed, the element of the catalyst material is actually segregated and dotted as a metal solid, not diffused uniformly as an atom or ion.

It is effective for prevention of the electrical characteristic degradation to perform a gettering process by which a catalyst material is removed from a silicon film. However, in the case where the thickness was large or the catalyst material was connected to the other element, the catalyst material cannot be completely removed from the film in some cases.

Specifically, since a thermal process such as a laser light irradiation is used in an element isolation process, the catalyst material segregated in the isolation region is diffused again in the silicon film; accordingly, degradation of electrical characteristics due to formation of impurity state and defects such as a short circuit or leakage of current between an upper and a lower cells or adjacent cells are caused in some cases. Therefore, it is desirable to develop a method of a more stable thin film crystal silicon based photoelectric conversion device.

Therefore, it is an object of an embodiment of the present invention to provide a structure and a fabrication method of crystal silicon based photoelectric conversion device which can suppress defects such as a short circuit or leakage of current which are caused due to the catalyst material.

An embodiment of the present invention relates to a photoelectric conversion device in which a catalyst material which promotes crystallization is selectively added to amorphous silicon formed over a substrate and crystal growth is performed to form an excellent photoelectric conversion layer, and in which defects such as a short circuit or leakage of current can be suppressed as much as possible and the fabrication method of the photoelectric conversion device.

According to an embodiment of the present invention disclosed in this specification, a photoelectric conversion device includes a first silicon semiconductor layer having one conductivity type and formed over a substrate, a second silicon semiconductor layer formed over the first silicon semiconductor layer, and a third silicon semiconductor layer having a conductivity type opposite to the one conductivity type and formed over the second silicon semiconductor layer, in which a region of the second silicon semiconductor layer except a vicinity of edges in a surface direction is a crystal layer formed by being crystallized with the use of a catalyst material which promotes crystallization of silicon, and in which the vicinity of edges in the surface direction of the second silicon semiconductor layer is a crystal layer formed by being crystallized without the use of the catalyst material or an amorphous layer.

According to another embodiment of the present invention disclosed in this specification, a photoelectric conversion device includes a first silicon semiconductor layer having one conductivity type and formed over a substrate, a second silicon semiconductor layer formed over the first silicon semiconductor layer, and a third silicon semiconductor layer having a conductivity type opposite to the one conductivity type and formed over the second silicon semiconductor layer, in which a region of the second silicon semiconductor layer except a vicinity of edges in a surface direction is a crystal layer which contains a catalyst material which promotes crystallization of silicon, and in which the vicinity of edges in the surface direction of the second silicon semiconductor layer is a crystal layer which does not contain the catalyst material or an amorphous layer.

According to another embodiment of the present invention disclosed in this specification, a photoelectric conversion device includes a first silicon semiconductor layer having one conductivity type and formed over a substrate, a second silicon semiconductor layer formed over the first silicon semiconductor layer, a third silicon semiconductor layer having a conductivity type opposite to the one conductivity type and formed over the second silicon semiconductor layer, a fourth silicon semiconductor layer having one conductivity type and formed over the third silicon semiconductor layer, a fifth silicon semiconductor layer formed over the fourth silicon semiconductor layer, and a sixth silicon semiconductor layer having a conductivity type opposite to the one conductivity type of the fourth silicon semiconductor layer and formed over the fifth silicon semiconductor layer, in which a region of the second silicon semiconductor layer except a vicinity of edges in a surface direction is a crystal layer formed by being crystallized with the use of a catalyst material which promotes crystallization of silicon, and in which the vicinity of edges in the surface direction of the second silicon semiconductor layer is a crystal layer formed by being crystallized without the use of the catalyst material or an amorphous layer.

According to another embodiment of the present invention disclosed in this specification, a photoelectric conversion device includes a first silicon semiconductor layer having one conductivity type and formed over a substrate, a second silicon semiconductor layer formed over the first silicon semiconductor layer, a third silicon semiconductor layer having a conductivity type opposite to the one conductivity type and formed over the second silicon semiconductor layer, a fourth silicon semiconductor layer having one conductivity type and formed over the third silicon semiconductor layer, a fifth silicon semiconductor layer formed over the fourth silicon semiconductor layer, and a sixth silicon semiconductor layer having a conductivity type opposite to the one conductivity type of the fourth silicon semiconductor layer and formed over the fifth silicon semiconductor layer, in which a region of the second silicon semiconductor layer except a vicinity of edges in a surface direction is a crystal layer which contains a catalyst material which promotes crystallization of silicon, and in which the vicinity of edges in the surface direction of the second silicon semiconductor layer which does not contain the catalyst material is a crystal layer or an amorphous layer.

The catalyst material which has promoted crystallization of a silicon thin film is segregated in the film, which causes defects such as a short circuit or leakage of current. In addition, the defect generation is strongly related to a structure of a photoelectric conversion device and its segregated positions. In particular, the catalyst material segregated in the vicinity of a region at which the silicon film is divided becomes a problem. In an isolation process for the silicon film, a method in which the silicon film is thermally divided with the use of a laser or the like is employed, so that the segregated catalyst material is diffused again, and a short circuit or leakage of current is likely to cause between an upper and a lower cells or the adjacent cells.

The above surface direction of the silicon semiconductor layer is referred to as a direction perpendicular to the thickness direction, and the edge of the silicon semiconductor layer is referred to as a portion to be divided by a laser or the like for element isolation of the photoelectric conversion device.

In other words, it is one of characteristics of an embodiment of the present invention that a high-quality crystal layer in which the catalyst material is used is provided in a specific light absorbing layer of the photoelectric conversion device and a crystal layer which has been crystallized without using the catalyst material is provided in the vicinity of the region where element isolation is performed. In addition, the vicinity of the region where element isolation is performed is not necessarily crystallized and may be amorphous. Thus, the vicinity of the region where element isolation is performed is formed without using the catalyst material in advance, so that defects such as a short circuit or leakage of current can be suppressed from being caused.

According to another embodiment of the present invention disclosed in this specification, a method for fabricating a photoelectric conversion device includes the successive steps of forming a first silicon semiconductor layer which contains an impurity imparting one conductivity type over a substrate, forming an amorphous silicon film as a second silicon semiconductor layer over the first silicon semiconductor layer, adding selectively a catalyst material which promotes crystallization of silicon to a plurality of regions over a surface of the second silicon semiconductor layer, crystallizing part of the second silicon semiconductor layer by a heat treatment performed for the second silicon semiconductor layer, forming a third silicon semiconductor layer which contains an impurity imparting a conductivity type opposite to the one conductivity type over the second silicon semiconductor layer, and dividing a stacked layer comprising the first, the second, and the third silicon semiconductor layers at a region to which the catalyst material is not added.

According to another embodiment of the present invention disclosed in this specification, a method for fabricating a photoelectric conversion device includes the successive steps of forming a first silicon semiconductor layer which contains an impurity imparting one conductivity type over a substrate, forming an amorphous silicon film as a second silicon semiconductor layer over the first silicon semiconductor layer, adding selectively a catalyst material which promotes crystallization of silicon to a plurality of regions over a surface of the second silicon semiconductor layer, crystallizing part of the second silicon semiconductor layer by a heat treatment performed for the second silicon semiconductor layer, forming a film containing phosphorus or a rare gas over the second silicon semiconductor layer, performing a heat treatment for the second silicon semiconductor layer and the film containing phosphorus or a rare gas, removing the film containing phosphorus or a rare gas, forming a third silicon semiconductor layer containing an impurity imparting a conductivity type opposite to the one conductivity type over the second silicon semiconductor layer, and dividing a stacked layer comprising the first, the second, and the third silicon semiconductor layers at a region to which the catalyst material is not added.

As the catalyst material which promotes crystallization of silicon, one or a plurality of elements selected from iron (Fe), nickel (Ni), cobalt (Co), ruthenium (Ru), rhodium (Rh), palladium (Pd), osmium (Os), iridium (Ir), platinum (Pt), copper (Cu), and gold (Au) can be used. In addition, these catalyst materials can be applied to the silicon semiconductor as an aqueous solution or the like which is made from the metal salt of the above elements. In addition, the catalyst material may be attached directly to the surface of the silicon semiconductor by a sputtering method, a vacuum evaporation method, or the like.

As a process of adding the above catalyst material selectively to the silicon semiconductor surface, a method by which the silicon surface is selectively irradiated with an ultraviolet light and an oxide film with wettability is selectively formed for the above aqueous solution. Alternatively, a method in which the catalyst material is partly added with the use of a mask, a lift-off method, or the like may be used.

In addition, as a process in which gettering of the catalyst material is performed after the second silicon semiconductor layer is crystallized, it is also possible to form an insulating film or a semiconductor film containing phosphorus or a rare gas (e.g., argon) over the second silicon semiconductor layer and perform a heat treatment.

In the case where a silicon semiconductor layer containing phosphorus is used for a film formed for gettering of the above catalyst material, the film can be used as an n-type semiconductor layer which forms a semiconductor junction as itself. Note that an n-type semiconductor layer may be additionally formed after the film is once removed.

According to an embodiment of the present invention, a region to be a light absorbing layer is crystallized by adding the catalyst material selectively to amorphous silicon, and a region adjacent to a region where element isolation is performed is kept as amorphous or is subjected to crystallization performed without using the catalyst material, so that defects such as a short circuit or leakage of current in the photoelectric conversion device can be suppressed.

BRIEF DESCRIPTION OF THE DRAWINGS

FIGS. 6A to 6C are process cross-sectional views illustrating a method for fabricating a multi-junction photoelectric conversion device.

DETAILED DESCRIPTION OF THE INVENTION

Embodiments are described in detail with reference to the drawings. Note that the present invention is not limited to the following description, and it is easily understood by those skilled in the art that various changes and modifications can be made without departing from the spirit and scope of the present invention. Therefore, the present invention should not be construed as being limited to the description in the following embodiments.

Embodiment 1

This embodiment describes a structure and a fabrication method of a photoelectric conversion device according to an embodiment of the present invention.

Figure 1A:
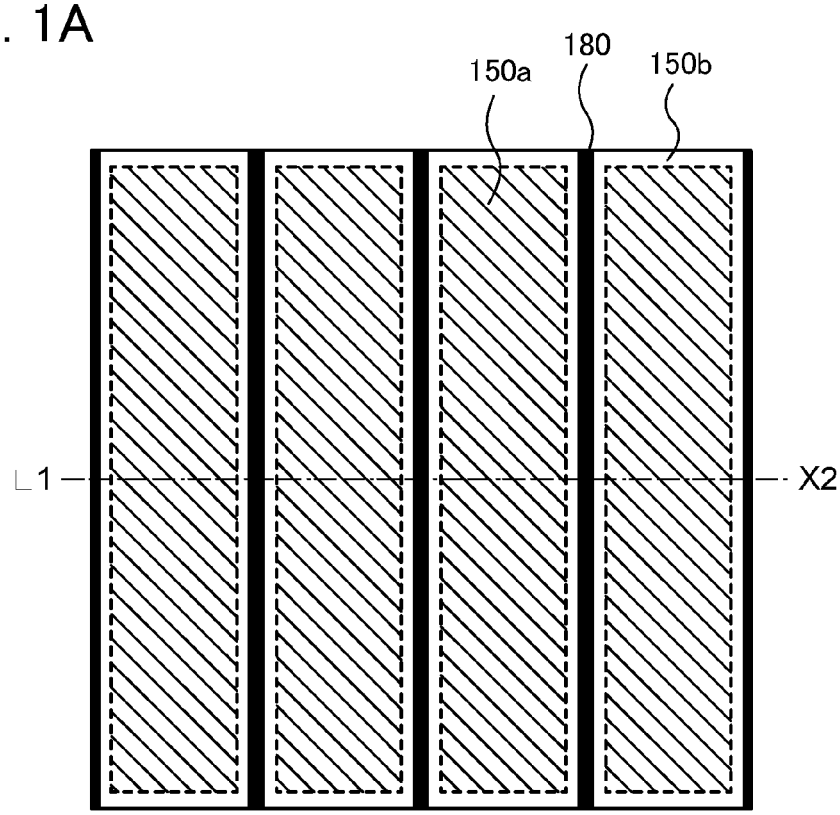
FIGS. 1A and 1B are cross-sectional views illustrating a photoelectric conversion device.
Figure 1B:
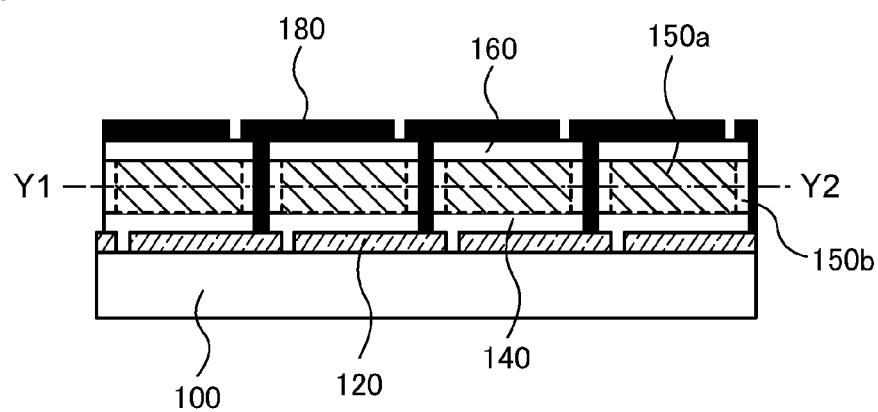

FIGS. 1A and 1B are cross-sectional views of an integrated photoelectric conversion device according to an embodiment of the present invention. FIG. 1A corresponds to a surface which is divided along the line Y1-Y2 in FIG. 1B, and illustrates a state in which a second semiconductor layer to serve as a light absorbing layer is divided in the surface direction. On the other hand, FIG. 1B illustrates a state of all layers which are divided along the line X1-X2 in FIG. 1A in the thickness direction.

A photoelectric conversion device according to this embodiment includes, over a light-transmitting insulating substrate 100, a light-transmitting conductive film 120, a first semiconductor layer 140, a first region 150a and a second region 150b of a second semiconductor layer, a third semiconductor layer 160, and a conductive layer 180. The photoelectric conversion device has an integrated structure in which adjacent cells are connected in series. Although not illustrated, adjacent cells may be connected in parallel.

Note that although a structure in which the light-transmitting conductive film 120 is formed over the light-transmitting insulating substrate 100 so that light enters from the substrate side is illustrated in FIGS. 1A and 1B, a structure in which light enters from the surface of the formed films may be used. In addition, a cell is a basic unit of a photoelectric conversion device and here referred to as one element including a pin junction.

For the light-transmitting conductive film 120 to be an electrode on the light incident side, indium tin oxide (ITO), zinc oxide (ZnO), tin oxide ($SnO_2$), or the like can be used.

For the first semiconductor layer 140, a silicon semiconductor film having one conductivity type can be used, and for the third semiconductor layer 160, a silicon semiconductor film having a conductivity type opposite to the one conductivity type can be used. Although amorphous layers can also be used for the first semiconductor layer 140 and the third semiconductor layer 160, it is preferable to use a crystal layer or a microcrystalline layer, which has low resistance. The one conductivity type corresponds to p-type and the conductivity type opposite to the one conductivity type corresponds to n-type in this embodiment, or vice versa.

For the conductive layer 180 to be an electrode on the back side, a metal such as aluminum, titanium, silver, nickel, or stainless steel, or a conductive paste such as a nickel paste, a silver paste, or a carbon paste can be used.

Next, the second semiconductor layer is described in detail.

The first region 150a of the second semiconductor layer shown in FIGS. 1A and 1B is a region including a high-quality crystal layer formed in such a manner that a catalyst material is selectively added to an amorphous silicon semiconductor and heat treatment is performed. By the heat treatment, an alloy of the metal element and silicon is formed in the amorphous silicon semiconductor, and crystallization progresses with this alloy as a nucleus, so that the first region 150a of the second semiconductor layer is formed.

In contrast, the second region 150b of the second semiconductor layer shown in FIGS. 1A and 1B is formed of a crystal layer obtained by being crystallized without adding a catalyst material to the amorphous silicon semiconductor and crystallization progresses. For example, crystallization can also be locally performed with the use of an excimer laser or the like. At this time, the region to which the catalyst material is added and which is crystallized in advance is also subjected to the laser irradiation so that the crystallinity is preferably further improved.

Alternatively, the second region 150b of the second semiconductor layer may be an amorphous layer. Crystallization of the amorphous silicon in the first region 150a to which the catalyst material is added can be performed at a comparatively low temperature of approximately 550° C. In the second region 150b to which a catalyst material is not added, crystallization does not occur at that temperature and the amorphous state is maintained.

Here, the first region 150a and the second region 150b of the second semiconductor layer have high resistance, and have a conductivity type which can be called i-type substantially.

Each of the widths of the first region 150a and the second region 150b of the second semiconductor layer can be determined as appropriate; however, the second region 150b of the second semiconductor layer is formed so that its area ratio to the first region 150a of the second semiconductor layer is smaller. The area ratio of the second region 150b to the first region 150a is made to be smaller; thus, conversion efficiency of the whole element can be prevented as much as possible from decreasing even if the second region 150b of the second semiconductor layer does not totally contribute to photoelectric conversion. Note that the subsequent isolation process is performed for the second region 150b of the second semiconductor layer; therefore, it is acceptable as long as the practitioners consider also the process accuracy and determine each of the widths of the first region 150a and the second region 150b of the second semiconductor layer as appropriate.

It is one of the greatest characteristics of an embodiment of the present invention to form a region to which a catalyst material is not added and to perform element isolation in the region in the above manner.

In the conventional photoelectric conversion device fabricated according to a method with the use of a catalyst material, the catalyst material was applied to the entire surface of the film, so that the catalyst material segregated in the isolation region was diffused again in the silicon film by a thermal means such as a laser or the like. Accordingly, the impurity state is formed, and deterioration of the electric characteristics and defects such as a short circuit and leakage of current between the upper and lower cells or the adjacent cells are caused.

Therefore, an attempt was carried out to reduce the above defects by employing a process for gettering of the catalyst material. However, in the case where the thickness of the semiconductor layer was too large or the catalyst material was connected to the other element such as oxygen in the semiconductor layer, it was difficult that the catalyst material is removed; therefore, the catalyst material in the film could not be completely removed.

According to an embodiment of the present invention, in an integrated photoelectric conversion device in which a plurality of isolated elements over the same substrate are connected in series or in parallel, the region in the vicinity of the isolation region is formed without using a catalyst material, so that defects such as a short circuit or leakage of current can be suppressed.

Next, a fabrication method of the photoelectric conversion device according to an embodiment of the present invention is described with referred to as process cross-sectional views of FIGS. 2A to 2D, and FIGS. 3A to 3C.

First, the light-transmitting conductive film 120 is formed over the light-transmitting insulating substrate 100. As the light-transmitting insulating substrate 100, the one whose stain point is 550° C. or more can be used. In addition, a comb-like metal electrode, which is not illustrated, for collecting current may be formed before the light-transmitting conductive film 120 is formed.

As the light-transmitting conductive film 120, indium tin oxide (ITO), zinc oxide (ZnO), tin oxide ($SnO_2$), or the like can be used, and it is preferable that the light-transmitting conductive film 120 be formed to 0.1 µm to 1 µm inclusive in thickness by a sputtering method or the like.

Figure 2A:
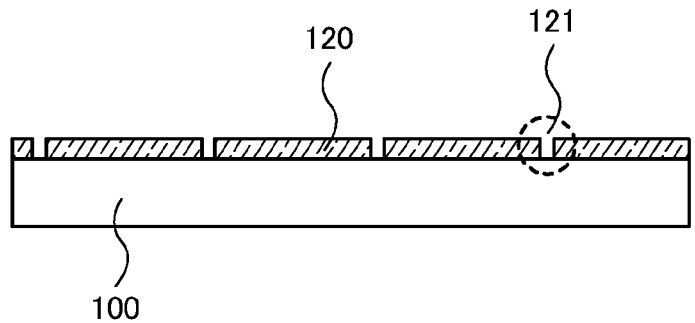
FIGS. 2A to 2D are process cross-sectional views illustrating a method for fabricating a photoelectric conversion device.
Figure 2B:
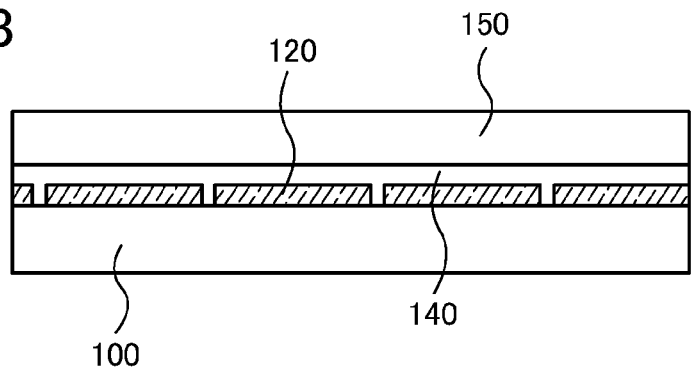
Figure 2C:
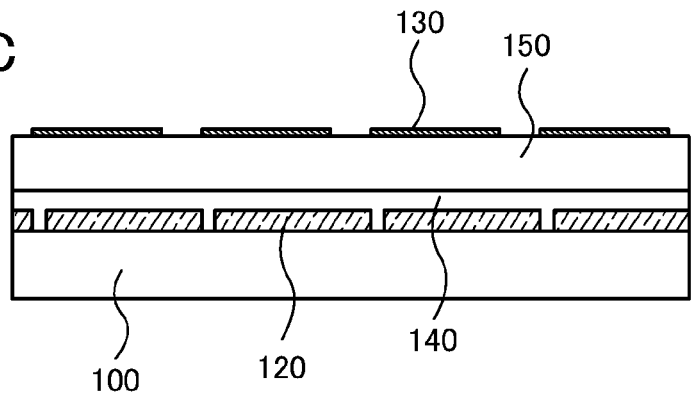
Figure 2D:
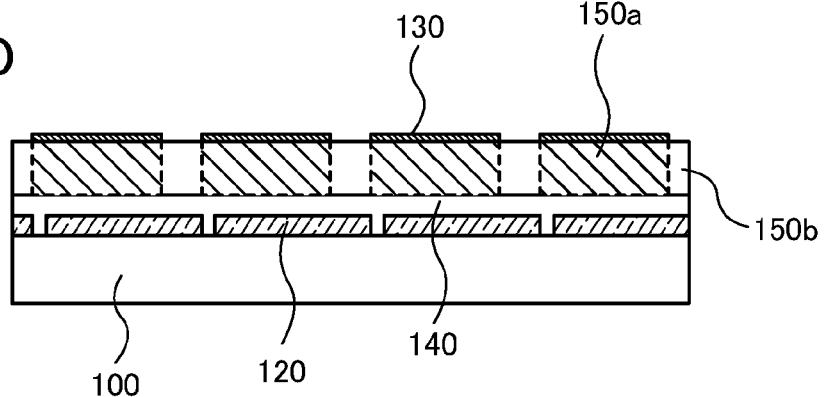

Next, the light-transmitting conductive film 120 is divided for the element isolation, and an isolation groove 121 is formed as shown in FIG. 2A. The light-transmitting conductive film 120 can be divided by a laser process or the like. As a laser used for this laser process, a continuous wave laser or a pulsed laser which emits light in an infrared light region is preferably used. For example, a Nd-YAG laser (wavelength: 1064 nm) can be used.

Next, the first semiconductor layer 140 is formed to 20 nm to 150 nm inclusive in thickness, or preferably 30 nm to 100 nm inclusive. In this embodiment, a doping gas containing an impurity imparting p-type conductivity is mixed into the source gas, and a p-type microcrystalline silicon film is formed by a plasma CVD method. As an impurity imparting p-type conductivity, boron, aluminum, or the like, which is an element belonging to Group 13 in the periodic table, is typically given. For example, a doping gas such as diborane is mixed into a source gas such as silane, so that a p-type microcrystalline silicon film can be formed.

An amorphous semiconductor layer 150 is formed over the first semiconductor layer 140. The fabrication method of this amorphous semiconductor layer 150 is not particularly limited; however, it is preferable that the amorphous semiconductor layer 150 be formed to 1 µm or more in thickness and that the fabrication method be a method by which the amorphous semiconductor layer 150 is formed at high speed (see FIG. 2B).

The amorphous semiconductor layer 150 can be formed by a plasma CVD method, a low-pressure CVD method, a sputtering method, or a vacuum evaporation method, for example. An amorphous silicon film is formed to 5 µm in thickness by a plasma CVD method here. It is preferable that the amorphous silicon film be a substantially intrinsic amorphous silicon film. As the source gas, silane or disilane is used, and hydrogen may be added thereto. At this time, atmospheric components contained in the film serve as a donor in some cases; therefore, 0.001 atom % to 0.1 atom % inclusive of boron (B) may be added to the film so that the conductivity type is closer to i-type.

Next, a catalyst material 130 for crystallizing the amorphous semiconductor layer 150 selectively and obtaining a high-quality crystal layer is selectively added over the amorphous semiconductor layer 150. For example, the catalyst material is selectively added so that the second region 150b of the second semiconductor layer is formed to approximately 500 µm in width. Note that the width has to be determined by considering the laser processing accuracy or the like as described above.

As the catalyst material 130, one or a plurality of elements selected from iron (Fe), nickel (Ni), cobalt (Co), ruthenium (Ru), rhodium (Rh), palladium (Pd), osmium (Os), iridium (Ir), platinum (Pt), copper (Cu), and gold (Au) can be used. In this embodiment, nickel, which is very excellent in its effect and reproducibility among the above metal elements, is used. Nickel silicide is formed using nickel and is to serve as a crystal nucleus when the amorphous silicon film is crystallized (see FIG. 2C).

In order to apply the catalyst material selectively to the amorphous semiconductor layer 150, a method can be used in which a thin oxide film is selectively formed over the amorphous semiconductor layer in advance and an aqueous solution in which salt of the above metal with wettability is dissolved is applied to the oxide film. As a method for forming the oxide film, ultraviolet irradiation, immersion in an ammonia hydrogen peroxide mixture or ozone water, or the like can be used. As a method for forming the oxide film selectively, a metal mask method, a lift-off method, or the like can be used. Note that the oxide film is not illustrated.

In this embodiment, the oxide film is selectively formed in such a manner that a metal mask is overlapped with the amorphous semiconductor layer, and ultraviolet irradiation is performed thereover in an atmosphere containing oxygen. In addition, nickel to serve as the catalyst material is selectively applied to the oxide film in a manner to use nickel acetate as the aqueous solution and use a spinning coater. The oxide film is very thin, and the catalyst material can reach the surface of the amorphous semiconductor layer through the oxide film. Note that the amorphous semiconductor layer is bare at a region over which an oxide film is not formed, and the surface is not applied with a nickel acetate aqueous solution because of its hydrophobic nature.

As a method different from the above, a method for attaching the catalyst material directly to the amorphous semiconductor layer thereover by a sputtering method or a vacuum evaporation method may be used.

Next, in a nitrogen atmosphere, the amorphous semiconductor layer 150 is heated with an electric furnace at 450° C. for an hour, so that hydrogen in the amorphous semiconductor layer 150 is removed. This is performed to lower the threshold energy in crystallization by forming dangling bonds intentionally in the amorphous semiconductor layer 150. Then, the amorphous semiconductor layer 150 is subjected to a heat treatment in a nitrogen atmosphere at a temperature of 550° C. for 4 to 8 hours inclusive, so that the amorphous semiconductor layer 150 is crystallized to form a crystal silicon layer to be the first region 150a of the second semiconductor layer. The reason why the temperature for crystallization can be as low as 550° C. in this step is the catalytic activity of nickel. In the heat treatment, nickel moves in the film while crystallizing the amorphous semiconductor layer 150. In this step, a region to which nickel is not applied is not crystallized, and the second region 150b of the second semiconductor layer is maintained in an amorphous state (see FIG. 2D).

The crystallization can also be performed by a rapid thermal annealing (RTA) method. The heat treatment is preferably performed at the temperature of 600° C. to 800° C. inclusive for 3 to 9 minutes inclusive with the use of nitrogen or an inactive gas such as a rare gas as the atmosphere.

Next, a process for crystallizing the second region 150b of the second semiconductor layer may be performed. For example, crystallization can be locally performed with the use of an excimer laser or the like. At this time, the region to which the catalyst material is added and which is crystallized in advance is also subjected to the laser irradiation so that the crystallinity is preferably further improved. The crystallization for the second region 150b of the second semiconductor layer can improve the contribution of the region to the photoelectric conversion. Note that the area ratio of the second region 150b of the second semiconductor layer to the first region 150a of the second semiconductor layer is smaller as described above; therefore, the contribution to improving the electric characteristics is small, so that this process may be omitted.

In the above manner, the first region 150a and the second region 150b of the second semiconductor layer are formed, and then the catalyst material and the oxide film left over the surface are removed with dilute fluorinated acid. Then, a third semiconductor layer 160 is formed to 20 nm to 150 nm inclusive, or preferably 30 nm to 100 nm inclusive in thickness (see FIG. 3A).

In this embodiment, a doping gas containing an impurity imparting n-type conductivity is mixed into a source gas, and a n-type microcrystalline silicon film is formed by a plasma CVD method as the third semiconductor layer 160. As the impurity imparting n-type conductivity, phosphorus, arsenic, antimony, or the like which is an element belonging to Group 15 in the periodic table is typically given. For example, a doping gas such as phosphine is mixed into a source gas such as silane, so that an n-type microcrystalline silicon layer can be formed.

Figure 3A:
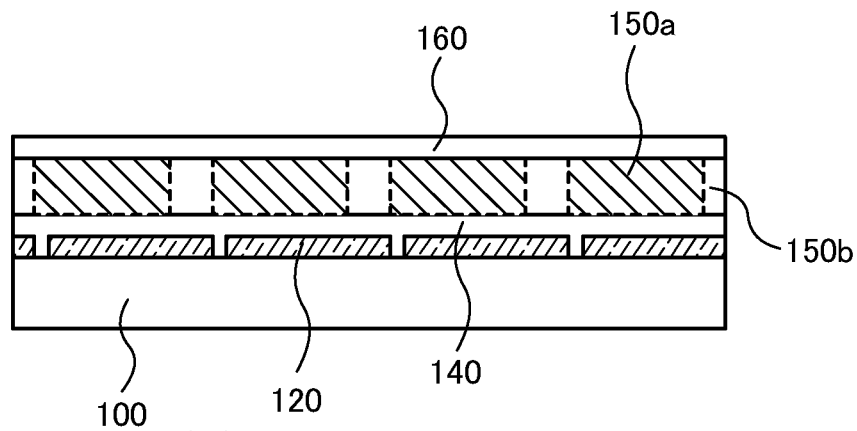
FIGS. 3A to 3C are process cross-sectional views illustrating a method for fabricating a photoelectric conversion device.
Figure 3B:
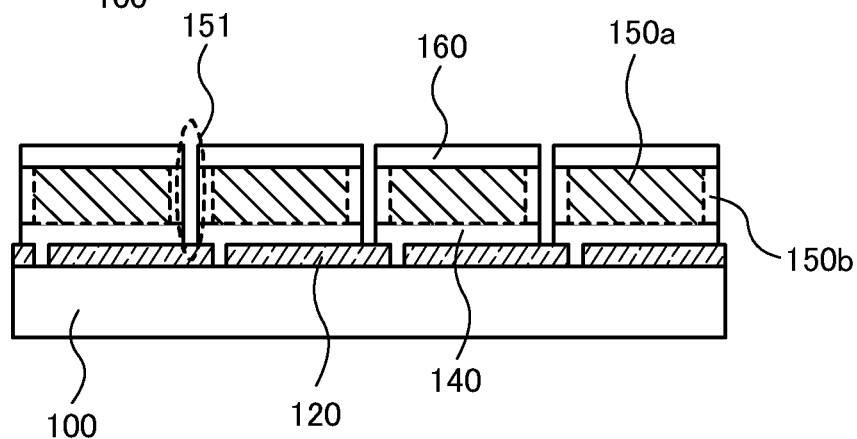

Next, an isolation groove 151 is formed through the first semiconductor layer 140, the second region 150b of the second semiconductor layer, and the third semiconductor layer 160 as shown in FIG. 3B by performing a laser process for element isolation. As a laser used for this laser process, a continuous wave laser or a pulsed laser which emits light in a visible light region or an infrared light region is preferably used. For example, a second harmonic (wave length: 532 nm) of an Nd-YAG laser can be used.

Here, it is important that the isolation groove be formed so that the second region 150b of the second semiconductor layer is divided. When an isolation groove is formed also in the first region 150a of the second semiconductor layer because of low laser processing accuracy, defects such as a short circuit or leakage of current are caused in some cases.

Figure 3C:
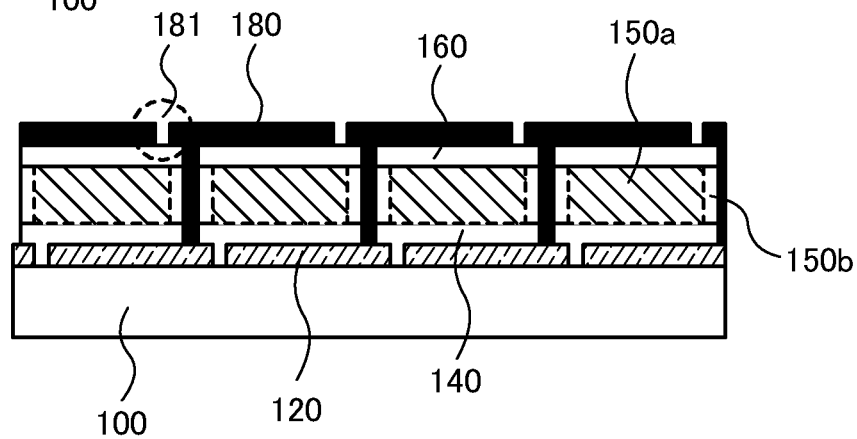

Next, a conductive layer 180 to serve as a back side electrode is formed as shown in FIG. 3C. For the conductive layer 180, a metal such as aluminum, titanium, silver, nickel, or stainless steel, or a conductive paste such as a nickel paste, a silver paste, or a carbon paste can be used. In this embodiment, the conductive layer 180 is formed of a nickel paste with the use of a screen printing method.

Note that a light-transmitting conductive film may be formed between the third semiconductor layer 160 and the conductive layer 180. In addition, roughness may be formed over the surface of the light-transmitting conductive film. Such a structure makes it possible to give a light-trapping effect and to improve the conversion efficiency.

Thus, a thin film crystal silicon based integrated photoelectric conversion device can be provided in which defects such as a short circuit or leakage of current can be suppressed and a good electrical characteristics can be obtained.

This embodiment can be implemented in appropriate combination with the structures described in the other embodiments.

Embodiment 2

In this embodiment, an example in which part of a fabrication process of a photoelectric conversion device is different from that of Embodiment 1 is described. In this embodiment, an example of a process is described in which a gettering process is performed for the first region 150a of the second semiconductor layer which contains a catalyst material and is crystallized so that the catalyst material segregated in the film is removed. Note that although the photoelectric conversion device can be formed without performing a gettering process as described in Embodiment 1, the catalyst material contained in the first region 150a of the second semiconductor layer can be reduced by a gettering process. Therefore, probability of occurrence of defects such as a short circuit or leakage of current can be further decreased.

First, according to FIGS. 2A to 2D described in Embodiment 1, the light-transmitting conductive film 120 is formed over the light-transmitting insulating substrate 100 and is subjected to a laser process, the first semiconductor layer 140 and the amorphous semiconductor layer 150 are formed, and the catalyst material is selectively added thereto, so that the first region 150a and the second region 150b of the second semiconductor layer are formed.

Figure 4A:
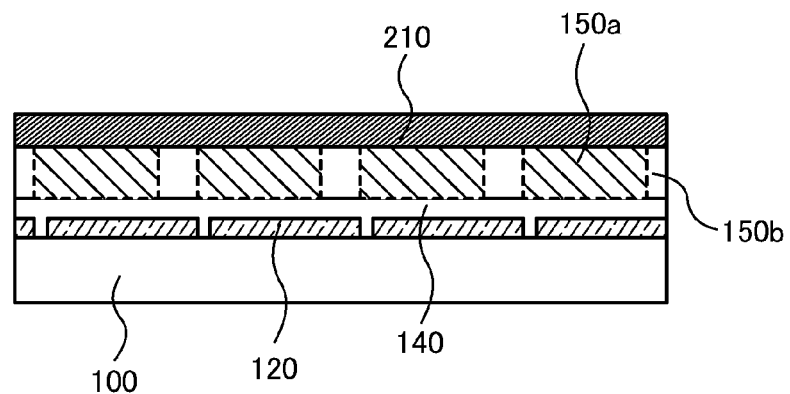
FIGS. 4A to 4D are cross-sectional views illustrating a gettering method.

As the gettering process, a PSG (phosphosilicate glass) 210 is formed first over the second semiconductor layer which contains the catalyst material and is crystallized (see FIG. 4A). The PSG 210 can be formed at the temperature of 450° C. by an atmospheric pressure CVD method with the use of a mixture gas of silane, phosphine, and oxygen. The phosphorus concentration in the PSG 210 is 1 wt % to 30 wt % inclusive, or preferably 5 wt % to 10 wt % inclusive.

Conducting the heat process in combination, the PSG 210 is for gettering of the catalyst material (which is nickel here) left in the first region 150a of the second semiconductor layer; however, the gettering effect can be achieved when the PSG 210 is just formed at a temperature of 450° C. More effectively, the PSG 210 is formed and a heat treatment is performed in a nitrogen atmosphere with the use of an electric furnace at a heat treatment temperature of 500° C. to 800° C. inclusive, or preferably at 550° C., for 1 to 4 hours inclusive. By this step, the nickel concentration in the first region 150a of the second semiconductor layer can be $5 \times 10^{18}/cm^3$ or lower.

Alternatively, as the heat treatment, a rapid thermal annealing (RTA) method can be similarly used for the crystallization. In this case, the heat treatment is preferably performed at a temperature of 600° C. to 800° C. inclusive under the atmosphere of nitrogen or an inactive gas such as a rare gas for 3 to 9 minutes inclusive.

Next, the PSG 210 is removed with dilute fluorinated acid, and the surface of the first region 150a of the second semiconductor layer from which the catalyst material is removed is made to be bare, and then the next process is performed.

As another means of the gettering process, a silicon film to which 0.1 wt % to 10 wt % of phosphorus is added can be used instead of the PSG 210, and a similar effect can be achieved.

Figure 4B:
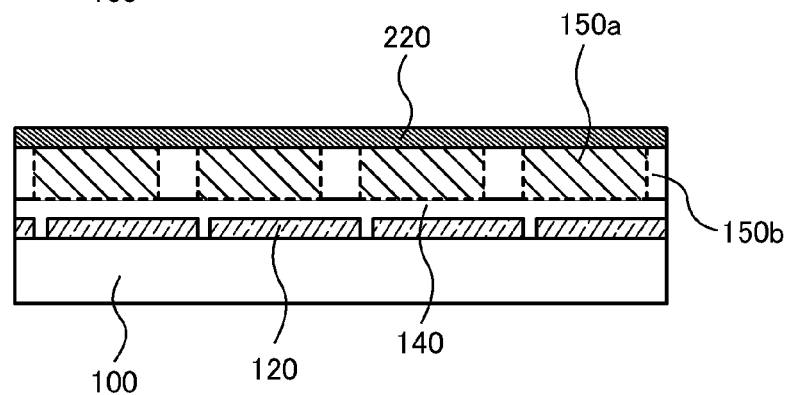

For example, a silicon film 220 containing phosphorus which corresponds to the third semiconductor layer described in Embodiment 1 is formed. Then, the heat treatment is performed in a nitrogen atmosphere at a thermal treatment temperature of 500° C. to 800° C. inclusive, or preferably at 550° C., for 1 to 4 hours inclusive, so that the catalyst material can be removed from the first region 150a of the second semiconductor layer (see FIG. 4B). Alternatively, the RTA method which is described above can be used.

In this state, although the silicon layer containing phosphorus contains the catalyst material at a relatively high concentration, the effect of the catalyst material is not a problem in the case where the silicon layer is used as an n-type semiconductor layer of a photoelectric conversion device. Therefore, the silicon layer can be used as an n-type semiconductor layer as it is.

Alternatively, the silicon layer containing phosphorus is removed and an n-type semiconductor layer may be additionally formed. In this case, before the silicon layer containing phosphorus is formed, a very thin oxide film may be formed in advance by an ultraviolet irradiation or immersion in an ammonia hydrogen peroxide mixture or ozone water. The silicon layer can be readily etched by using an alkaline solution such as a tetramethylammonium hydroxide (TMAH) solution or a 2-hydroxyethyltrimethylammonium hydroxide (choline) solution. Then, a silicon oxide film is rarely etched with the above alkaline solution; therefore, only the silicon layer can be selectively removed.

For the addition of phosphorus into the silicon film, a method of injecting phosphorus ions can be used instead of a method of forming a film by mixing a source gas and a dopant gas by a CVD method or the like.

Figure 4C:
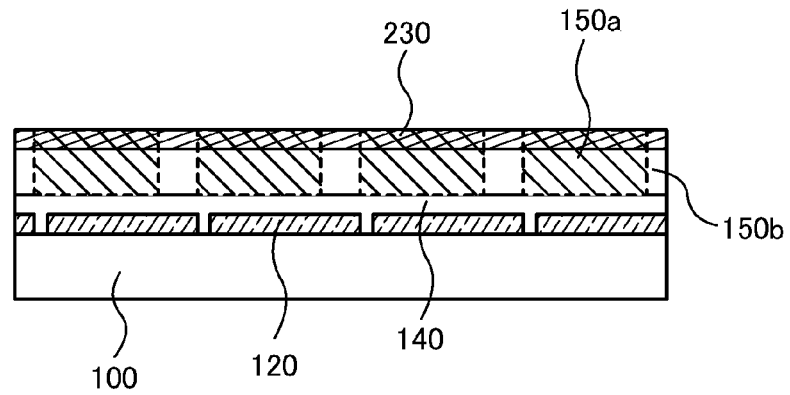

For example, phosphorus ions can be directly injected into the first region 150a of the second semiconductor layer by a plasma doping method. The dose is preferably more than or equal to $1 \times 10^{14}/cm^2$ and less than or equal to $1 \times 10^{17}/cm^2$, or typically $1 \times 10^{16}/cm^2$. By this doping process, an injection layer 230 containing phosphorus at a high concentration is formed (see FIG. 4C).

Through the subsequent heat treatment, the injection layer 230 containing phosphorus at a high concentration affects gettering of the catalyst material and crystallization is promoted; therefore, the injection layer 230 is changed into an n-type crystal silicon layer. Thus, this n-type crystal silicon layer can be used as an n-type semiconductor layer of a photoelectric conversion device.

Figure 4D:
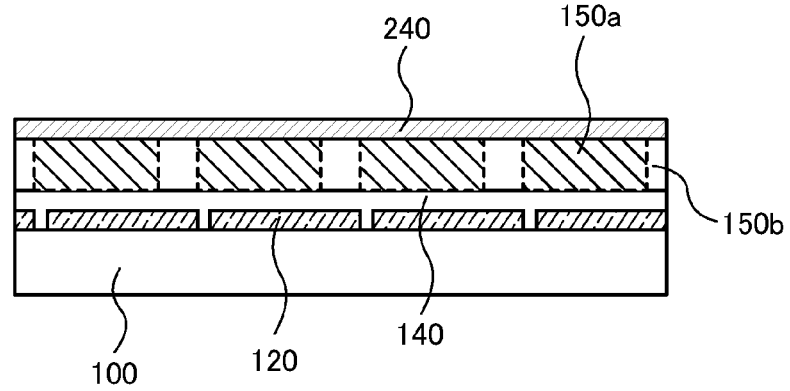

As an alternative method, a method in which a silicon film 240 containing a rare gas is used can be used (see FIG. 4D). Specifically, a silicon film containing one of or a plurality of rare gas elements selected from helium (He), neon (Ne), argon (Ar), krypton (Kr), and xenon (Xe) is formed over the first region 150a of the second semiconductor layer, and a similar heat treatment is performed at the above temperature and for the above time.

The silicon film 240 containing a rare gas is preferably 20 nm to 40 nm inclusive in thickness. The rare gas element is added to the silicon film, and dangling bond, lattice distortion, or the like is formed in the silicon film, so that the catalyst material can be introduced into the silicon film. It is to be noted that, in order to form lattice distortion in the silicon film, it is effective to use an element having a larger atomic radius than silicon, such as argon (Ar), krypton (Kr) or xenon (Xe). Note that for the addition of a rare gas into a silicon film, a method can be used in which a film is formed with the use of a CVD method by mixing a source gas and a rare gas, or a method can be used in which a film is formed with the use of a sputtering method by using a rare gas which is to be added as a sputtering gas.

After the gettering process is completed, the silicon film containing a rare gas may be etched with alkali solution in a manner similar to the case of using the above silicon film containing phosphorus. Note that in order to remove selectively the silicon film formed for gettering, a very thin oxide film or the like is preferably formed in advance over the second semiconductor layer before the silicon film is formed, as described above.

By the above methods, the catalyst material can be removed from the first region 150a of the second semiconductor layer, and a photoelectric conversion device can be completed through processes of the crystallization process and its subsequent processes according to Embodiment 1.

This embodiment can be implemented in appropriate combination with the structures described in the other embodiments.

Embodiment 3

In this embodiment, a multi-junction photoelectric conversion device, which has a different structure from that of the photoelectric conversion device described in Embodiment 1 or Embodiment 2 and the fabrication method of the multi-junction photoelectric conversion device are described.

The multi-junction photoelectric conversion device is a photoelectric conversion device in which two or more of photoelectric conversion layers which have different light-absorption wavelength ranges are provided, and has characteristics in which solar light having a wide range of wavelength distribution can be converted efficiently into electricity.

As a thin film photoelectric conversion device, a tandem type, a triple type, or the like is known, and an amorphous silicon based material and a crystal silicon based material are used for its photoelectric conversion layer. In the tandem type, an amorphous silicon based material capable of absorbing more light in a visible light region is used for a top cell on the light incident side, and a crystal silicon based material capable of absorbing more light in an infrared light region is used for a bottom cell, for example. At this time, light enters from a light-transmitting substrate such as a glass substrate in general according to the specification; thus, an amorphous silicon based cell is formed first, and then, a crystal silicon based cell is formed later.

In the fabrication method of crystal silicon according to an embodiment of the present invention, the photoelectric conversion device can be fabricated relatively at a low temperature with the use of the catalyst material. However, a heat treatment is necessarily performed at approximately 550° C. When the tandem structure is formed in the above order, hydrogen desorbs from the amorphous silicon based photoelectric conversion layer; thus, the electrical characteristics significantly deteriorates. Accordingly, it is a characteristics of the multi-junction photoelectric conversion device according to an embodiment of the present invention that the crystal silicon based cell is formed over the substrate in advance, and then, the amorphous silicon based cell is formed later. In this embodiment, the structure and the fabrication method thereof are described.

Figure 5:
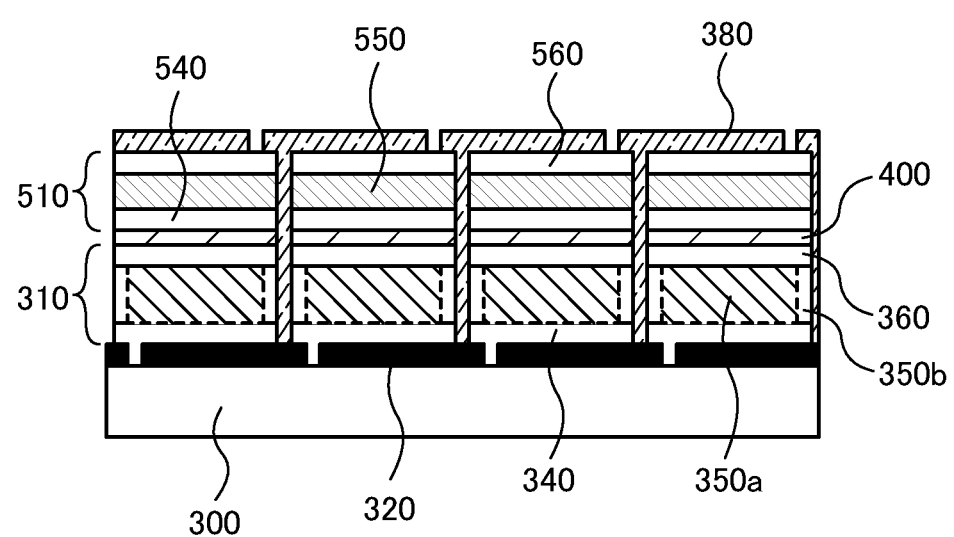
FIG. 5 is a cross-sectional view illustrating a multi junction photoelectric conversion device.

FIG. 5 illustrates a multi-junction (tandem type) photoelectric conversion device according to an embodiment of the present invention. A conductive layer 320 is formed over a substrate 300. A bottom cell 310 including a first semiconductor layer 340, a first region 350a and a second region 350b of a second semiconductor layer, and a third semiconductor layer 360 is formed over the conductive layer 320. Additionally, a top cell 510 including a fourth semiconductor layer 540, a fifth semiconductor layer 550, and a sixth semiconductor layer 560 is stacked over the bottom cell 310 with an interlayer 400 interposed therebetween, and a light-transmitting conductive film 380 is formed so as to connect the adjacent cells in series.

In the multi-junction photoelectric conversion device of this embodiment, the substrate 300 does not necessarily have a light-transmitting property because light enters from the top cell 510 side. Therefore, for the substrate 300, a ceramic substrate such as an alumina substrate, a heat-resistant resin substrate, or a metal substrate such as a stainless steel substrate whose surface is subjected to an insulating treatment can be also used instead of a glass substrate.

For the conductive layer 320, a light-transmitting conductive film is used in Embodiment 1; however, a metal film capable of withstanding the temperature at which the second semiconductor layer is crystallized in the subsequent step. Specifically, nickel, stainless steel, titanium, tantalum, tungsten, molybdenum, or the like can be used, and aluminum can also be used only if the aluminum is interposed between such metals. In addition, although not illustrated, a light-transmitting conductive film may be formed between the conductive layer 320 and the first semiconductor layer 340; furthermore, roughness may be formed over the light-transmitting conductive film. Such a structure makes it possible to give a light-trapping effect and to improve the conversion efficiency.

For the bottom cell 310, a high-quality crystal silicon thin film is used which is formed with the use of the catalyst material for the first region 350a of the second semiconductor layer to serve as a light absorbing layer, and the thickness or the composition of each layer is similar to those in the structure described in Embodiment 1. Note that it is preferable that the conductivity type of the first semiconductor layer 340 be n-type, and the conductivity type of the third semiconductor layer 360 be p-type in this embodiment because light enters in a direction from the opposite side to the substrate. Note that the conductivity types can also be opposite to the above.

In the top cell 510, an i-type amorphous silicon thin film is used for the fifth semiconductor layer 550 to be a light absorbing layer. For the fourth semiconductor layer 540, a silicon semiconductor film having one conductivity type can be used, and for the sixth semiconductor layer 560, a silicon semiconductor film having a conductivity type opposite to the one conductivity type can be used. Although amorphous layers can also be used for the fourth semiconductor layer 540 and the sixth semiconductor layer 560, it is preferable to use a crystal layer or a microcrystalline layer, which has low resistance.

It is preferable that the conductivity type of the fourth semiconductor layer 540 is n-type, and the conductivity type of the sixth semiconductor layer 560 is p-type in this embodiment because light enters in a direction from the opposite side to the substrate. Although the conductivity types can also be opposite to the above, the third semiconductor layer 360 and the fourth semiconductor layer 540 necessarily have the different conductivity types from each other in the case where the bottom cell 310 and the top cell 510 are connected in series. For example, when the third semiconductor layer 360 is p-type, the fourth semiconductor layer 540 is made to be n-type.

For the light-transmitting conductive film 380 to be an electrode on the light incident side, indium tin oxide (ITO), zinc oxide (ZnO), tin oxide ($SnO_2$), or the like can be used.

The top cell 510 and the bottom cell 310 are connected through the interlayer 400. For this interlayer, a wide gap semiconductor or a material whose main component is the same as that of the light-transmitting conductive film 380 can be used. However, if the material has a low resistance, the material and the light-transmitting conductive film 380 are short-circuited; therefore, it is preferable that a high-resistant light-transmitting conductive film to which silicon oxide or the like is added be used, for example. Specifically, a material whose electrical conductivity is approximately 1 S/cm as the upper limit and lower than it can be preferably used. Note that although this interlayer 400 contributes to a light-trapping effect, it can also be omitted.

Next, a fabrication method of a tandem photoelectric conversion device according to an embodiment of the present invention is described with referred to as process cross-sectional views of FIGS. 6A to 6C.

As described above, for the conductive layer 320, a light-transmitting conductive film is used in Embodiment 1; however, a metal film capable of withstanding the temperature at which the process of crystallization of the second semiconductor layer is used in this embodiment. In addition, the conductive layer 320 is divided in advance by a laser process or the like for element isolation. Except for a method for forming this conductive layer 320, a photoelectric conversion layer in which a crystal silicon layer is used as a light absorbing layer can be formed according to the method described in Embodiment 1, and stacked films to be the bottom cell 310 is formed. The stacked films includes an n-type first semiconductor layer 340, a first region 350a and a second region 350b of an i-type second semiconductor layer, and a p-type third semiconductor layer 360; their fabrication methods correspond respectively to those of the first semiconductor layer 140, the first region 150a and the second region 150b of the second semiconductor layer, and the third semiconductor layer 160 which are described in Embodiment 1.

Next, the interlayer 400 is formed over the stacked films. For the interlayer 400, a light-transmitting conductive film of tin oxide, indium tin oxide, zinc oxide, or the like, or a wide gap semiconductor such as silicon carbide, silicon nitride, silicon oxide can be used. Alternatively, composition of the above materials may be used, and here, indium tin oxide containing silicon oxide is formed by a sputtering method.

Next, stacked films to be the top cell 510 are formed over the interlayer. In this embodiment, a p-type silicon semiconductor film is formed as the fourth semiconductor layer 540, an i-type silicon semiconductor film is formed as the fifth semiconductor layer 550, and an n-type silicon semiconductor film is formed as the sixth semiconductor layer 560.

For the fourth semiconductor layer 540 and the sixth semiconductor layer 560 of them, a silicon film similar to those for the first semiconductor layer 140 and the third semiconductor layer 160 described in Embodiment 1 can be used, and can be formed according to the same film formation methods.

Also the fifth semiconductor layer 550 can be formed according to a film formation method for the amorphous semiconductor layer 150 described in Embodiment 1. Note that the fifth semiconductor layer 550 is used in amorphous state for the light absorbing layer of the top cell 510 in this embodiment; therefore, crystallization process is not performed. Thus, a stacked structure in FIG. 6A is formed.

Next, an isolation groove 511 is formed in the stacked structure, and the element is isolated. The isolation groove 511 can be formed by a method similar to that in which the isolation groove 151 is formed as described in Embodiment 1 (see FIG. 6B). For example, a second harmonic (wavelength: 532 nm) of an Nd-YAG laser can be used. At this time, a state in which the isolation groove 511 is not formed in the conductive layer 320 is illustrated; however, this process control is difficult, and the isolation groove 511 may be formed in the conductive layer 320.

Here, it is important that the isolation groove be formed so as to divide a region of the second region 350b of the second semiconductor layer. When an isolation groove is formed in a region including the first region 350a of the second semiconductor layer because of low laser processing accuracy, defects such as a short circuit or leakage of current are caused in some cases.

Next, the light-transmitting conductive film 380 is formed over the top cell 510. The light-transmitting conductive film 380 can be formed in a manner similar to that in which the light-transmitting conductive film 120 is formed as described in Embodiment 1. At this time, the light-transmitting conductive film 380 is also formed in the isolation groove 511 and connected to the conductive layer 320. Also in the case where the isolation groove 511 is formed in the conductive layer 320 as described above, the light-transmitting conductive film 380 can be connected to the conductive layer 320 through the side surface of the isolation groove 511.

An isolation groove 381 is formed in the light-transmitting conductive film 380 formed over the top cell 510, and an integrated photoelectric conversion device in which the isolated elements are connected in series is completed. The isolation groove 381 can be formed in a manner similar to that in which the isolation groove 121 is formed as described in Embodiment 1. The isolation groove 381 may be formed through a photolithography process and an etching process instead of the above method.

Note that although a structure in which the top cell 510 and the bottom cell 310 are connected in series is described in this embodiment, a structure may be used in which electric power of the top cell 510 and the bottom cell 310 can be separately extracted. In this case, the electric power is extracted from each of the cells through a DC-DC converter, and system for synthesizing the electric power is connected to a charging circuit or the like.

Thus, a multi-junction integrated photoelectric conversion device can be provided in which defects such as a short circuit or leakage of current can be suppressed and a good electrical characteristics can be obtained.

This embodiment can be implemented in appropriate combination with the structures described in the other embodiments.

This application is based on Japanese Patent Application serial no. 2010-028310 filed with the Japan Patent Office on Feb. 11, 2010, the entire contents of which are hereby incorporated by reference.

What is claimed is:
1. A method for fabricating a photoelectric conversion device comprising:
  forming a first silicon semiconductor layer containing an impurity imparting one conductivity type;
  forming an amorphous silicon film as a second silicon semiconductor layer over the first silicon semiconductor layer;
  adding selectively a catalyst material which promotes crystallization of silicon to a first region of the second silicon semiconductor layer;
  crystallizing the first region of the second silicon semiconductor layer by a heat treatment;
  forming a film containing phosphorus or a rare gas over the second silicon semiconductor layer;
  performing a heat treatment for the second silicon semiconductor layer and the film containing the phosphorus or the rare gas;
  removing the film containing the phosphorus or the rare gas; and forming a third silicon semiconductor layer which contains an impurity imparting a conductivity type opposite to the one conductivity type over the second silicon semiconductor layer.

2. The method for fabricating a photoelectric conversion device according to claim 1, wherein the catalyst material which promotes crystallization of silicon is one or a plurality of elements selected from Fe, Co, Ni, Ru, Rh, Pd, Os, Ir, Pt, Cu, and Au.

3. The method for fabricating a photoelectric conversion device according to claim 1, further comprising the step of:
dividing a stacked layer comprising the first, the second, and the third silicon semiconductor layers at a second region to which the catalyst material is not added,
wherein the second region of the second silicon semiconductor layer comprises polycrystalline silicon.

4. The method for fabricating a photoelectric conversion device according to claim 1, further comprising the step of:
dividing a stacked layer comprising the first, the second, and the third silicon semiconductor layers at a second region to which the catalyst material is not added,
wherein the second region of the second silicon semiconductor layer comprises amorphous silicon.

5. A method for fabricating a photoelectric conversion device comprising the successive steps of:
forming a first silicon semiconductor layer containing an impurity imparting one conductivity type over a substrate;
forming an amorphous silicon film as a second silicon semiconductor layer over the first silicon semiconductor layer;
adding selectively a catalyst material which promotes crystallization of silicon to a first region of the second silicon semiconductor layer;
crystallizing the first region of the second silicon semiconductor layer by a heat treatment performed for the second silicon semiconductor layer;
forming a film containing phosphorus or a rare gas over the second silicon semiconductor layer;
performing a heat treatment for the second silicon semiconductor layer and the film containing the phosphorus or the rare gas;
removing the film containing the phosphorus or the rare gas;
forming a third silicon semiconductor layer which contains an impurity imparting a conductivity type opposite to the one conductivity type over the second silicon semiconductor layer; and
dividing a stacked layer comprising the first, the second, and the third silicon semiconductor layers at a second region to which the catalyst material is not added.

6. The method for fabricating a photoelectric conversion device according to claim 5, wherein the catalyst material which promotes crystallization of silicon is one or a plurality of elements selected from Fe, Co, Ni, Ru, Rh, Pd, Os, Ir, Pt, Cu, and Au.

7. The method for fabricating a photoelectric conversion device according to claim 5, wherein the second region of the second silicon semiconductor layer comprises polycrystalline silicon.

8. The method for fabricating a photoelectric conversion device according to claim 5, wherein the second region of the second silicon semiconductor layer comprises amorphous silicon.

9. A method for fabricating a photoelectric conversion device comprising the successive steps of:
forming a first silicon semiconductor layer containing an impurity imparting one conductivity type over a substrate;
forming an amorphous silicon film as a second silicon semiconductor layer over the first silicon semiconductor layer;
adding selectively a catalyst material which promotes crystallization of silicon to a plurality of first regions of the second silicon semiconductor layer;
crystallizing the plurality of first regions of the second silicon semiconductor layer by a heat treatment performed for the second silicon semiconductor layer;
forming a film containing phosphorus or a rare gas over the second silicon semiconductor layer;
performing a heat treatment for the second silicon semiconductor layer and the film containing the phosphorus or the rare gas;
removing the film containing the phosphorus or the rare gas;
forming a third silicon semiconductor layer which contains an impurity imparting a conductivity type opposite to the one conductivity type over the second silicon semiconductor layer; and
dividing a stacked layer comprising the first, the second, and the third silicon semiconductor layers at a second region to which the catalyst material is not added.

10. The method for fabricating a photoelectric conversion device according to claim 9, wherein the film containing the phosphorus or the rare gas is an insulating film or a semiconductor film.

11. The method for fabricating a photoelectric conversion device according to claim 9, wherein the catalyst material which promotes crystallization of silicon is one or a plurality of elements selected from Fe, Co, Ni, Ru, Rh, Pd, Os, Ir, Pt, Cu, and Au.

12. The method for fabricating a photoelectric conversion device according to claim 9, wherein the second region of the second silicon semiconductor layer comprises polycrystalline silicon.

13. The method for fabricating a photoelectric conversion device according to claim 9, wherein the second region of the second silicon semiconductor layer comprises amorphous silicon.

* * * * *